United States Patent
Tanabe et al.

(10) Patent No.: US 6,744,133 B2
(45) Date of Patent: Jun. 1, 2004

(54) ADHESIVE FILM FOR SEMICONDUCTOR, LEAD FRAME AND SEMICONDUCTOR DEVICE USING THE SAME

(75) Inventors: Yoshiyuki Tanabe, Ichihara (JP); Hidekazu Matsuura, Ichihara (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/212,264

(22) Filed: Aug. 6, 2002

(65) Prior Publication Data

US 2003/0102573 A1 Jun. 5, 2003

(30) Foreign Application Priority Data

Aug. 6, 2001 (JP) .................................. 2001-238218
Jul. 4, 2002 (JP) .................................. 2002-196226

(51) Int. Cl.[7] .................. H01L 23/06; H01L 23/48; H01L 23/52; H01L 23/28; H01L 23/34; H01L 23/10; H01L 29/40
(52) U.S. Cl. .................. 257/707; 257/692; 257/684; 257/782; 257/706; 257/693; 257/696; 257/787; 257/694
(58) Field of Search ................. 257/692, 684, 257/707, 777, 782, 706, 693, 696, 787, 694, 666, 689

(56) References Cited

U.S. PATENT DOCUMENTS 5,869,888 A * 2/1999 Tsubosaki et al. .......... 257/692
6,566,422 B1 * 5/2003 Yagi et al. .................. 523/440

FOREIGN PATENT DOCUMENTS

| JP | 5-105850 A | 4/1993 |
| JP | 05-112760 A | 5/1993 |
| JP | 05-112761 A | 5/1993 |

* cited by examiner

Primary Examiner—Nathan J. Flynn
Assistant Examiner—Victor A. Mandala, Jr.
(74) Attorney, Agent, or Firm—Antonelli, Terry, Stout & Kraus, LLP

(57) ABSTRACT

An adhesive film for semiconductor comprises a support film, and adhesive layers formed on both surfaces of the support film, in which each adhesive layer comprises an adhesive having a glass transition temperature of 200° C. or less, a coefficient of linear expansion of 70 ppm or less, and a storage elastic modulus of 3 GPa or less, and the adhesive film has a total thickness of between 43 and 57 µm. A lead frame for semiconductor comprises a lead frame and an adhesive film for semiconductor according to the present invention. A semiconductor device comprises a lead frame and a semiconductor element, in which the lead frame and the semiconductor element are adhered to each other via an adhesive film for semiconductor according to the present invention.

17 Claims, 1 Drawing Sheet

ADHESIVE FILM FOR SEMICONDUCTOR, LEAD FRAME AND SEMICONDUCTOR DEVICE USING THE SAME

BACKGROUND OF THE INVENTION

1. Field of the Invention

The present invention relates to an adhesive film for semiconductor, a lead frame and a semiconductor device using the same.

2. Description of the Related Art

In recent years, large-sized semiconductor chips are increasingly manufactured for mass storage and high performance. In contrast, packages for such semiconductor chips are required to be small-sized in view of limitations for print circuit designs, and demand for miniaturized electronic devices. Correspondingly, some new mounting modes have been proposed to deal with the densification and the high density mounting of semiconductor chips. One mounting mode is a lead on chip (LOC) mode for memory devices in which leads are adhered onto the chips. The LOC mode enables rationalization of in-chip wiring and wire bonding, high speed signal transmission by wiring compaction, and a small-sized package.

In such a new mode, there is provided an adhesion interface between the semiconductor chip and the lead frame, which are composed of different materials. Its adhesion reliability largely affects the reliability of a semiconductor package. Also significantly, a wire connecting the semiconductor chip and the lead frame should not be broken in a temperature cycle test (heat cycle test) which is one of indices for the semiconductor package reliability, as well as thermal durability during package assembling processes, and adhesion workability.

For such adhesion, a paste adhesive, or an adhesive applied to a heat-resistant substrate has been conventionally used. One example is a hot-melt type adhesive film using a polyimide resin. See Japanese Unexamined Patent Application Publication Nos. 5-105850, 5-112760, and 5-112761. The hot melt type adhesive has high glass transition temperature, and therefore adheres to an adherend only at very high temperature. The adherend such as high density semiconductor chips and copper lead frames is likely to be thermally damaged.

SUMMARY OF THE INVENTION

In order to provide an excellent semiconductor package temperature cycle property, the adhesive film needs to have a reduced coefficient of linear expansion close to that of the semiconductor chip and the lead frame, and a decreased storage elastic modulus for relaxing stress induced by the temperature cycle. However, if the storage elastic modulus is too small, the semiconductor chip cannot be connected to the lead frame upon wire bonding in the semiconductor package manufacturing steps.

As semiconductors have become more integrated, the material for the lead frame has changed from 42 alloy to copper for high-speed signal processing. Further, a low temperature adhesion property and a temperature cycle property are also needed to prevent oxidation of copper due to heat upon the tape and the chip adhesion, and to relax thermal stress due to a difference between the thermal expansion coefficient of the copper and that of the chip.

Accordingly, it is an object of the present invention to provide an adhesion film for semiconductor that allows a semiconductor element to adhere to a lead frame at low temperatures with an excellent temperature cycle property.

Another object is to provide a lead frame with an adhesive film that can adhere to a semiconductor element at low temperatures, and can provide a highly reliable semiconductor device.

Still another object is to provide a highly reliable semiconductor device adhered with an adhesive film that adheres at low temperatures and provides an excellent temperature cycle property.

The present inventors have been engaged in the development of an adhesive film for semiconductor having both a low temperature adhesive property and an excellent temperature cycle property. As a result, it has been found that the above-mentioned problems can be solved by using an adhesive having specific properties, and by limiting the total thickness of an adhesive film including a support film and the adhesive layers on both sides of the support film.

A first aspect of the present invention provides an adhesive film for semiconductor, comprising: a support film; and adhesive layers formed on both surfaces of the support film, in which each adhesive layer comprises an adhesive having a glass transition temperature of 200° C. or less, a coefficient of linear expansion of 70 ppm or less, and a storage elastic modulus of 3 GPa or less, and the adhesive film has a total thickness of between 43 and 57 μm.

A second aspect of the present invention provides a lead frame with an adhesive film for semiconductor, comprising: a lead frame, and the aforementioned adhesive film for semiconductor according to the present invention adhered to the lead frame.

A third aspect of the present invention provides a semiconductor device, comprising a lead frame and a semiconductor element, in which the lead frame and the semiconductor element are adhered to each other by means of the aforementioned adhesive film for semiconductor according to the present invention.

DESCRIPTION OF THE PREFERRED EMBODIMENTS

Figure 1:
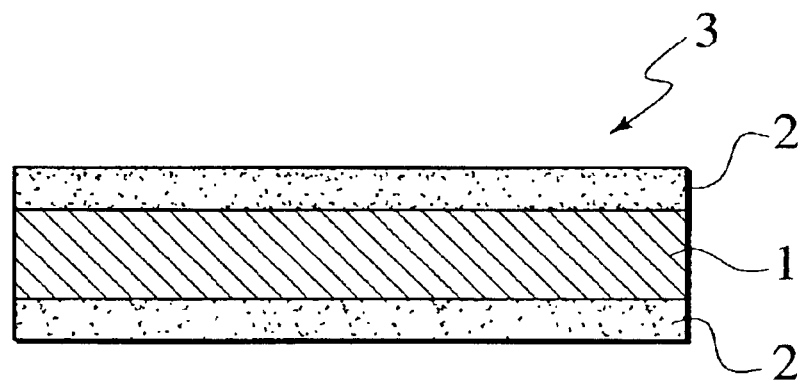
FIG. 1 is a cross-sectional view schematically showing an embodiment of an adhesive film for semiconductor according to the present invention.

An adhesive film for semiconductor (hereinafter simply referred to as an "adhesive film") according to the present invention is a three-layered double-coated adhesive film including a support film, and adhesive layers formed on both surfaces of the support film. The adhesive film has the total thickness of between 43 and 57 μm. Each of the adhesive layers of the adhesive film includes an adhesive having a glass transition temperature (hereinafter referred to as "Tg") of 200° C. or less, a coefficient of linear expansion of 70 ppm or less, and a storage elastic modulus of 3 GPa or less.

The Tg of the adhesive is 200° C. or less in view of low temperature adhesion property, preferably 190° C. or less, and is preferably 120° C. or more in view of package reliability, for example, for reflow crack resistance, and more preferably 160 to 185° C. The coefficient of linear expansion of the adhesive is 70 ppm or less in view of a temperature cycle property (thermal/heat cycle property), preferably 30 ppm or more in view of a low temperature adhesion property, and more preferably 50 to 68 ppm. The storage elastic modulus of the adhesive is 3 GPa or less in view of a temperature cycle property, preferably 1 to 2.8 GPa, and more preferably 1.5 to 2.5 GPa. If the storage elastic modulus is too low, the adhesive becomes soften to adversely affect the wire bonding, and the coefficient of linear expansion increases, which may adversely affect the temperature cycle property.

In view of the reflow crack resistance of the resulting semiconductor device, an overflow length of the adhesive is preferably 2 mm or less, more preferably 1 mm or less, and still more preferably 0.5 mm or less. Here, the overflow length is a length of the adhesive that overflows from a longitudinal side of an adhesive film sample in a perpendicular direction, which is measured at a midpoint of the longitudinal side of the adhesive film sample, after the adhesive film sample is pressed at a pressure of 3 MPa and at a temperature of 350° C. for 1 minute. The adhesive film sample has a total thickness of 50 μm, a width of 19 mm, and a length of 50 mm, which comprises a support film having a thickness of 25 μm and the two adhesive layers each having a thickness of 12.5 μm on both sides of the support film. When the overflow length of the adhesive is 2 mm or less, an excellent reflow crack resistance that is an important property for the semiconductor package can be obtained, even if the Tg of the adhesive is low.

The adhesive having the above-described properties preferably comprises an adhesive composition containing as a main component one or more heat-resistant thermoplastic resin such as a polyimide resin and a polyamide resin. The polyimide resin herein means a resin having an imide group such as a polyamideimide resin, a polyesterimide resin, and a polyetherimide resin. The polyimide resin is produced by thermal or chemical ring-forming (ring-closing) of polyamide acid. With adhesive strength taken into consideration, a resin containing an amide group is preferably used. The amide group herein means an amide group that remains after imide ring closure, and does not include an amide group in the amide acid that is an imide precursor. The preferred proportion of the amide group ranges from not less than 10 mol % in view of adhesive strength to not more than 90 mol % in view of water absorption, more preferably 20 to 70 mol %, and still more preferably 30 to 50 mol %, based on the total amount of the imide group and the amide group which remains after the imide ring closure.

In a preferred embodiment, the resin contained in the adhesive is synthesized basically using diamine (A) and/or diisocyanate (A'), and acid anhydride (B) and/or dicarboxylic acid (C) or its amide-forming derivative (C'). The combination, the ratio, the molecular weight of these components, the reaction conditions, the presence or absence of additives, the types of the additives, if any, the addition of epoxy resins are adjusted such that the adhesive has predetermined properties, i.e., the Tg, the coefficient of linear expansion, the storage elastic modulus, and preferably the above-defined overflow length.

Examples of the diamine (A) include alkylenediamines such as hexamethylenediamine, octamethylenediamine, and dodecamethylenediamine; arylenediamines such as paraphenylenediamine, metaphenylenediamine, and metatoluylenediamine; diaminodiphenyl derivatives such as 4,4'-diaminodiphenylether (DDE), 4,4'-diaminodiphenylmethane, 4,4'-diaminodiphenylsulfone, 3,3'-diaminodiphenylsulfone, 4,4'-diaminobenzophenone, 3,3'-diaminobenzophenone, 4,4'-diaminobenzanilide; 1,4-bis(4-aminocumyl)benzene (BAP), 1,3-bis(4-aminocumyl)benzene, 1,3-bis(3-aminophenoxy)benzene, 1,4-bis(3-aminophenoxy)benzene, 1,4-bis(4-aminophenoxy)benzene, 2,2-bis[4-(4-aminophenoxy)phenyl]propane (BAPP), 2,2-bis[4-(3-aminophenoxy)phenyl]propane, bis[4-(3-aminophenoxy)phenyl]sulfone (m-APPS), bis[4-(4-aminophenoxy)phenyl]sulfone, 2,2-bis[4-(4-aminophenoxy)phenyl]hexafluropropane, diamines represented by the following general formula (1):

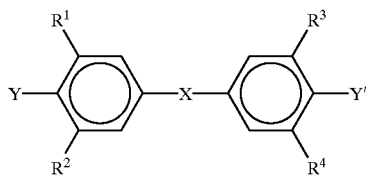

where Y and Y' each represent an amino group, $R^1$, $R^2$, $R^3$, and $R^4$ are each independently hydrogen, or an alkyl or alkoxy group having 1 to 4 carbon atoms, provided that at least two of them are an alkyl or alkoxy group, and X is —$CH_2$—, —$C(CH_3)_2$—, —O—, —$SO_2$—, —CO— or —NHCO—, and siloxanediamine represented by the general formula (2):

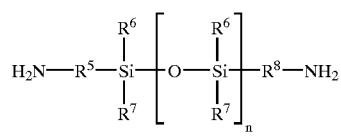

where $R^5$ and $R^8$ are each independently a divalent organic group, $R^6$ and $R^7$ are each independently a monovalent organic group, and n is an integer of 1 to 100. These diamines are used alone or in combination.

Specific examples of the compound represented by the formula (1) include 4,4'-diamino-3,3',5,5'-tetramethyldiphenylmethane, 4,4'-diamino-3,3',5,5'-tetraethyldiphenylmethane, 4,4'-diamino-3,3',5,5'-tetra-n-propyldiphenylmethane, 4,4'-diamino-3,3',5,5'-tetraisopropyldiphenylmethane, 4,4'-diamino-3,3',5,5'-tetrabutyldiphenylmethane, 4,4'-diamino-3,3'-dimethyl-5,5'-diethyldiphenylmethane, 4,4'-diamino-3,3'-dimethyl-5,5'-diisopropyldiphenylmethane, 4,4'-diamino-3,3'-diethyl-5,5'-diisopropyldiphenylmethane, 4,4'-diamino-3,5-dimethyl-3',5',-diethyldiphenylmethane, 4,4'-diamino-3,5-dimethyl-3',5'-diisopropyldiphenylmethane, 4,4'-diamino-3,5-diethyl-3',5'-diisopropyldiphenylmethane, 4,4'-diamino-3,5-diethyl-3',5'-dibutyldiphenylmethane, 4,4'-diamino-3,5-diisopropyl-3',5'-dibutyldiphenylmethane, 4,4'-diamino-3,3'-diisopropyl-5,5'-dibutyldiphenylmethane, 4,4'-diamino-3,3'-dimehtyl-5,5'-dibutyldiphenylmethane, 4,4'-diamino-3,3'-diethyl-5,5'-dibutyldiphenylmethane, 4,4'-diamino-3,3'-dimethyldiphenylmethane, 4,4'-diamino-3,3'-diethyldiphenylmethane, 4,4'-diamino-3,3'-di-n-propyldiphenylmethane, 4,4'-diamino-3,3'-diisopropyldiphenylmethane, 4,4'-diamino-3,3'-dibutyldiphenylmethane, 4,4'-diamino-3,3',5-trimethyldiphenylmethane, 4,4'-diamino-3,3',5-triethyldiphenylmethane, 4,4'-diamino-3,3',5-tri-n-propyldiphenylmethane, 4,4'-diamino-3,3',5-triisopropyldiphenylmethane, 4,4'-diamino-3,3',5-tributyldiphenylmethane, 4,4'-diamino-3-methyl-3'-ethyldiphenylmethane, 4,4'-diamino-3-methyl-3'-isopropyldiphenylmethane, 4,4'-diamino-3-ethyl-3'-isopropyldiphenylmethane, 4,4'-diamino-3-ethyl-3'-butyldiphenylmethane, 4,4'-diamino-3-isopropyl-3'- butyldiphenylmethane, 4,4'-diamino-2,2'-bis(3,3',5,5'-tetramethyldiphenyl)isopropane, 4,4'-diamino-2,2'-bis(3,3', 5,5'-tetraethyldiphenyl)isopropane, 4,4'-diamino-2,2'-bis(3,3',5,5'-tetra-n-propyldiphenyl)isopropane, 4,4'-diamino-2,2'-bis(3,3',5,5'-tetraisopropyldiphenyl)isopropane, 4,4'-diamino-2,2'-bis(3,3',5,5'-tetrabutyldiphenyl)isopropane, 4,4'-diamino-3,3',5,5'-tetramethyldiphenylether, 4,4'-diamino-3,3',5,5'-tetraethyldiphenylether, 4,4'-diamino-3,3', 5,5'-tetra-n-propyldiphenylether, 4,4'-diamino-3,3',5,5'-tetraisopropyldiphenylether, 4,4'-diamino-3,3',5,5'-tetrabutyldiphenylether, 4,4'-diamino-3,3',5,5'-tetramethyldiphenylsulfone, 4,4'-diamino-3,3',5,5'-tetraethyldiphenylsulfone, 4,4'-diamino-3,3',5,5'-tetra-n-propyldiphenylsulfone, 4,4'-diamino-3,3',5,5'-tetraisopropyldiphenylsulfone, 4,4'-diamino-3,3',5,5'-tetrabutyldiphenylsulfone, 4,4'-diamino-3,3',5,5'-tetramethyldiphenylketone, 4,4'-diamino-3,3',5,5'-tetraethyldiphenylketone, 4,4'-diamino-3,3',5,5'-tetra-n-propyldiphenylketone, 4,4'-diamino-3,3',5,5'-tetraisopropyldiphenylketone, 4,4'-diamino-3,3',5,5'-tetrabuthyldiphenylketone, 4,4'-diamino-3,3',5,5'-tetramethylbenzanilide, 4,4'-diamino-3,3',5,5'-tetraethylbenzanilide, 4,4'-diamino-3,3',5,5'-tetra-n-propylbenzanilide, 4,4'-diamino-3,3',5,5'-tetraisopropylbenzanilide, and 4,4'-diamino-3,3',5,5'-tetrabutylbenzanilide.

The $R^5$ and $R^8$ in the general formula (2) are preferably each independently trimethylene group, tetramethylene group, phenylene group, toluylene group, and so on. The $R^6$ and $R^7$ in the general formula (2) are preferably each independently methyl group, ethyl group, phenyl group, and so on. Plural $R^6$ and plural $R^7$ may be the same or different each other. In the siloxanediamine represented by the general formula (2), when the $R^5$ and $R^8$ are each trimethylene group, $R^6$ and $R^7$ are each methyl group, and m is 1, an average of about 10, an average of about 20, an average of about 30, an average of about 50, and an average of about 100, such compounds are commercially available from Shin-Etsu Chemical Co., Ltd. under the trade designations LP-7100, X-22-161AS, X-22-161A, X-22-161B, X-22-161C, and X-22-161E respectively.

The diisocyanate (A') is preferably obtained by substituting the amino group with an isocyanate group in the diamines listed above. These are used alone or in combination.

Examples of the acid anhydride (B) include trimellitic acid anhydride, pyromellitic acid dianhydride, 3,31,4,41-benzophenonetetracarboxylic acid dianhydride (BTDA), 3,3',4,4'-biphenyltetracarboxylic acid dianhydride, 2,2-bisphthalic acid hexafluoroisopropylidene dianhydride, bis(3,4-dicarboxyphenyl)ether dianhydride, bis(3,4-dicarboxyphenyl)sulfone dianhydride, 4,4'-bis(3,4-dicarboxyphenoxy)diphenylsulfone dianhydride, 2,2-bis[4-(3,4-dicarboxyphenoxy)phenyl]propane dianhydride, ethyleneglycolbistrimellitate dianhydride (EBTA), decamethyleneglycolbistrimellitate dianhydride (DBTA), bisphenol A bistrimellitate dianhydride (BABT), 2,2-bis[4-(3,4-dicarboxyphenylbenzoyloxy)phenyl]hexafluoropropane dianhydride, 4,4'-[1,4-phenylenebis(1-methylethylidene)]bisphenylbistrimellitate dianhydride, maleic anhydride, methyl maleic anhydride, nadic anhydride, allyl nadic anhydride, methyl nadic anhydride, tetrahydro phthalic acid anhydride, and methyltetrahydro phthalic acid anhydride. These are used alone or in combination.

Examples of the dicarboxylic acid (C) include terephthalic acid, isophthalic acid, biphenyl carboxylic acid, phthalic acid, naphthalene dicarboxylic acid, and diphenylether dicarboxylic acid. Examples of the amide-forming derivatives (C') of the dicarboxylic acid include dichlorides, and dialkylesters of these dicarboxylic acid. Alternatively, a part of the diamines (A) and the dicarboxylic acids (C) may be substituted with an amino carboxylic acid such as aminobenzoic acid. These are used alone or in combination.

More preferably, examples of the diamine (A) include alkylenediamine, metaphenylenediamine, metatoluylenediamine, 4,4'-diaminodiphenylether (DDE), 4,4'-diaminodiphenylmethane, 4,4'-diaminodiphenylsulfone, 3,3'-diaminodiphenylsulfone, 3,3'-diaminobenzophenone, 1,3-bis(4-aminocumyl)benzene, 1,4-bis(4-aminocumyl)benzene, 1,3-bis(3-aminophenoxy)benzene, 1,4-bis(3-aminophenoxy)benzene, 1,4-bis(4-aminophenoxy)benzene, 2,2-bis[4-(4-aminophenoxy)phenyl]propane (BAPP), bis[4-(3-aminophenoxy)phenyl]sulfone (m-APPS), bis[4-(4-aminophenoxy)phenyl]sulfone, 2,2-bis[4-(4-aminophenoxy)phenyl]hexafluoropropane, 4,4'-diamino-3,3',5,5'-tetramethyldiphenylmethane, 4,4'-diamino-3,3',5,5'-tetraethyldiphenylmethane, 4,4'-diamino-3,3',5,5'-tetraisopropyldiphenylmethane, 4,4'-diamino-3,3'-dimethyl-5,5'-diethyldiphenylmethane, 4,4'-diamino-3,3'-dimethyl-5,5'-diisopropyldiphenylmethane, 4,4'-diamino-3,3'-diethyl-5,5'-diisopropyldiphenylmethane, 4,4'-diamino-3,3'-dimethyldiphenylmethane, 4,4'-diamino-3,3'-diethyldiphenylmethane, 4,4'-diamino-3,3'-diisopropyldiphenylmethane, and the siloxane diamines represented by the general formula (2) which are commercially available under the trade designations LP-7100, X-22-161AS, and X-22-161A.

More preferably, examples of the acid anhydride (B) include trimellitic acid anhydride, 3,3',4,4'-benzophenonetetracarboxylic acid dianhydride (BTDA), 2,2-bisphthalic acid hexafluoroisopropylidene dianhydride, bis(3,4-dicarboxyphenyl)ether dianhydride, bis(3,4-dicarboxyphenyl)sulfone dianhydride, 4,4'-bis(3,4-dicarboxyphenoxy)diphenylsulfone dianhydride, 2,2-bis[4-(3,4-dicarboxyphenoxy)phenyl]propane dianhydride, ethyleneglycolbistrimellitate dianhydride (EBTA), decamethyleneglycolbistrimellitate dianhydride (DBTA), bisphenol A bistrimellitate dianhydride (BABT), 4,4'-[1,4-phenylenebis(1-methylethylidene)]bisphenylbistrimellitate dianhydride, maleic anhydride, nadic anhydride, and allyl nadic anhydride.

The adhesive used in the adhesive film may contain a coupling agent in order to improve adhesive strength with the support film. Examples of the coupling agent include silane coupling agents such as γ-(2-aminoethyl)aminopropyltrimethoxysilane, γ-(2-aminoethyl)aminopropylmethyldimethoxysilane, γ-metacryloxypropyltrimethoxysilane, γ-methacryloxypropylmethyldimethoxysilane, γ-glycidoxypropyltrimethoxysilane, γ-glycidoxypropylmethyldimethoxysilane, γ-mercaptopropyltrimethoxysilane, vinyltriacetoxysilane, vinyltriethoxysilane, vinyltrimethoxysilane, vinyltrichlorsilane, γ-chloropropyltrimethoxysilane, γ-anilinopropyltrimethoxysilane, γ-ureidopropyltriethoxysilane, methyltrimethoxysilane, methyltriethoxysilane, and hexamethyldisilane; titanate coupling agents such as isopropyltriisostealoyltitanate, isopropyltrioctanoyltitanate, isopropyltridodecylbenzenesulfonyltitanate, and isopropyltris(dioctylpyrophosphate)titanate; and aluminum coupling agents such as acetoalkoxy aluminum diisopropylate. These are used alone or in combination. The proportion of the coupling agent is preferably 0.5 to 20 parts by weight, and more preferably 2 to 10 parts by weight, based on 100 parts by weight of the heat-resistant thermoplastic resin in the adhesive. The amount of the coupling agent exceeding 20 parts by weight has a tendency to decrease heat resistance, and the adhesive strength between the adhesive and the lead frame or the semiconductor element.

The adhesive may further contain epoxy resin, its curing agent, a curing accelerator, and a filler such as ceramic powder, glass powder, silver powder, and copper powder. The epoxy resin has an average of two or more epoxy groups per molecule. Non-limiting examples include diglycidylether of bisphenol A, diglycidylether of bisphenol F, phenol novolac type epoxy resin, polyglycidylester of multivalent alcohol, polyglycidylester of polybasic acid, alicyclic epoxy resin, and hydantoin type epoxy resin.

Referring to FIG. 1 which shows one embodiment of the present invention, an adhesive film 3 has a three-layered structure including a support film 1, and adhesive layers 2,2 on both surfaces of the support film 1. The total thickness of the adhesive film 3 is 43 $\mu$m or more in view of adhesive strength between the adhesive and the lead frame or the semiconductor element, and is 57 $\mu$m or less in view of the temperature cycle property, preferably 45 to 55 $\mu$m, and more preferably 47 to 53 $\mu$m. The thickness of each adhesive layer is preferably 1 $\mu$m or more in view of the adhesive strength and productivity, preferably 30 $\mu$m or less in view of the temperature cycle property, and more preferably 10 to 15 $\mu$m.

Examples of the support film include insulation heat-resistant resin films such as polyimide, polyamide, polysulfone, polyphenylenesulfide, polyetheretherketone, polyallylate, and polycarbonate. The thickness of the support film is not especially limited, but preferably 5 to 50 $\mu$m, and more preferably 20 to 30 $\mu$m. The Tg of the support film is preferably higher than that of the adhesive, and is preferably 200° C. or more, and more preferably 250° C. or more. The water absorption of the support film is preferably 3% by weight or less, and more preferably 2% by weight or less.

In a preferred embodiment, the support film is the insulation heat-resistant resin film having the Tg of 250° C. or more, the water absorption of 2% by weight or less, and the thermal expansion coefficient of $3\times10^{-5}/°$ C. or less. In view of the above, it is especially preferable that the support film is the polyimide film.

The support film is preferably surface-treated before use. The surface treatment is for improving adhesive strength between the support film and the adhesive layer, and for preventing the adhesive layer from peeling off the support film. Examples of the surface treatment include chemical treatments such as alkali treatment and silane coupling treatment; physical treatments such as sand matt treatment; plasma treatment; and corona treatment. Suitable surface treatment depends on the types of the adhesive. The chemical or plasma treatment is especially suitable for the present invention.

A method for forming the adhesive layer on the support film is not especially limited. For example, the adhesive is dissolved in an organic solvent to provide adhesive varnish, which is applied to both surfaces of the support film. There can be used any organic solvents that can dissolve and mix the adhesive components uniformly. Non-limiting examples include dimethylformamide, dimethylacetamide, N-methyl-2-pyrrolidone, dimethylsulfoxide, diethyleneglycoldimethylether, toluene, benzene, xylene, methylethylketone, tetrahydrofuran, and dioxane. They may be used in combination. Any coating methods can be used including roll coating, reverse roll coating, gravure coating, bar coating, and comma coating. Alternatively, the support film may be passed through the adhesive varnish to be coated. However, sometimes it may be difficult to control the thickness.

The adhesive varnish is coated onto the support film, and then heated to remove the solvent and to imidate, whereby the adhesive film having the three-layered structure can be manufactured. The heating temperature is set to remove the solvent. The coating and drying may be conducted at one side and then at the other side in turn, or at both sides concurrently.

According to the present invention, a lead frame with an adhesive film for semiconductor comprises a lead frame, and the aforementioned adhesive film according to the present invention adhered to the lead frame. The adhesive film of the present invention can adhere to the semiconductor element at low temperature. Therefore, the highly reliable lead frame with the adhesive film can advantageously be manufactured conveniently with good workability and high yield. Furthermore, even if the lead frame is made of copper, which is easily oxidized, the lead frame with the adhesive film is advantageously manufactured by using the adhesive film of the present invention because of its excellent adhesive property at low temperature.

The lead frame with the adhesive film is, for example, manufactured by cutting the adhesive film of the present invention into pieces of a predetermined size, and adhering the pieces to the lead frame. Any cutting methods are applicable as long as the adhesive film can be cut precisely into a predetermined shape and size. It is preferable that the adhesive film be cut using a die into the pieces and be adhered to predetermined positions on the lead frame, with workability taken into consideration. The adhesive film is adhered preferably at 150° C. or more in view of the adhesive strength, and preferably 300° C. or less in view of the thermal degradation of the adhesive layer and the oxidation of the lead frame, and more preferably 200 to 250° C. The adhesive film is generally adhered preferably at a pressure of 0.1 to 20 MPa, and more preferably 0.3 to 10 MPa. If the pressure is less than 0.1 MPa, the adhesive strength may be insufficient. If the pressure exceeds 20 MPa, the adhesive may extend beyond the predetermined position, resulting in poor dimensional accuracy. The adhesive film is pressed for a time long enough for adherence at the prescribed temperature and pressure. With workability taken into consideration, it is preferable that the time is 0.3 to 60 seconds, and more preferably 0.5 to 10 seconds.

According to the present invention, the semiconductor device comprises a lead frame and a semiconductor element, in which the lead frame and the semiconductor element are adhered each other via the aforementioned adhesive film according to the present invention. The use of the adhesive film of the present invention enables one to conveniently manufacture the semiconductor element having high reliability with good workability and high yield.

Figure 2:
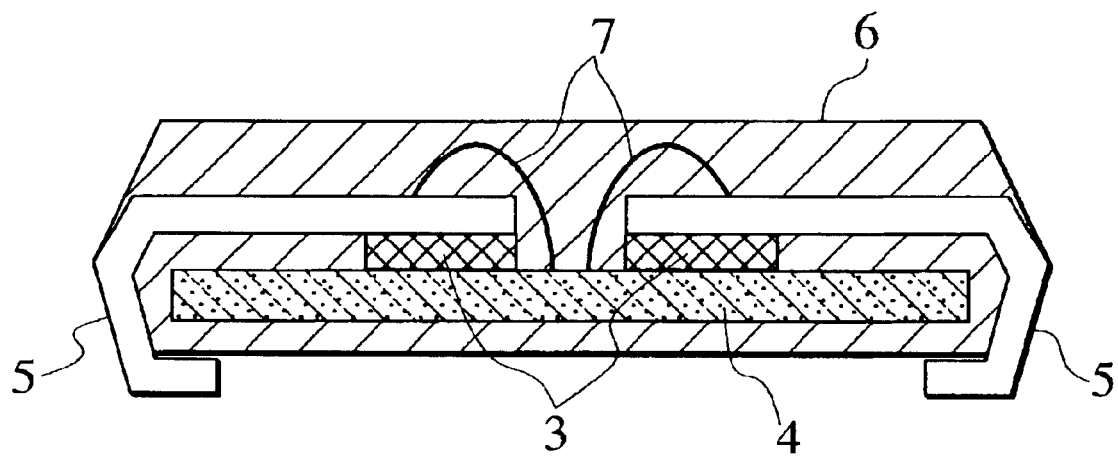
FIG. 2 is a cross-sectional view schematically showing an embodiment of a semiconductor device according to the present invention.

For example, the lead frame with the adhesive film thus-formed is used to produce a semiconductor device shown in FIG. 2 as follows: A semiconductor element 4 adheres to one surface of an adhesive film 3 of a lead frame 5 with an adhesive film 3, another surface of which is adhered to a lead frame 5. The adhesive film 3 is cured, as required. The lead frame 5 is connected to the semiconductor element 4 with a bonding wire 7 made of, for example, gold. A sealing material 6 such as the epoxy resin is used to seal via transfer molding. Thus, a semiconductor package having the LOC structure is fabricated. The lead frame may be equipped with a busbar (not shown).

The semiconductor chip 4 is adhered preferably at 150° C. or more in view of adhesive strength, and preferably 300° C. or less in view of the thermal degradation of the adhesive layer and the oxidation of the lead frame, and more preferably 200 to 250° C. The semiconductor chip 4 is generally adhered preferably at a pressure of 0.1 to 20 MPa, and preferably 0.3 to 10 MPa. If the pressure is less than 0.1 MPa, the adhesive strength may be insufficient. If the pressure exceeds 20 MPa, the adhesive may exceed the predetermined position, resulting in poor dimensional accuracy, and there is concern that the semiconductor chip 4 might be broken. The semiconductor chip 4 is pressed for a time long enough to adhere at the prescribed temperature and pressure. With workability taken into consideration, it is preferable that the time is 0.3 to 60 seconds, and more preferably 0.5 to 10 seconds.

EXAMPLE

The present invention will be described referring to the following non-limiting examples.

1. Adhesive Varnish Preparation (1) Adhesive Varnish A of Polyamideimide A

In a 5 liter four neck flask equipped with a thermometer, an agitator, a nitrogen inlet tube, and a fractionating column, 205.0 g (0.5 mol) of 2,2-bis[4-(4-aminophenoxy)phenyl] propane was introduced under nitrogen, and dissolved in 1200 g of N-methyl-2-pyrrolidone (hereinafter referred to as "NMP"). The solution was cooled to −10° C., and 105.3 g (0.5 mol) of trimellitic acid monochloride was added so that the temperature did not exceed −5° C. After the trimellitic acid monochloride was dissolved, 76 g of triethylamine was added so that the temperature did not exceed 5° C. After 1 hour agitation at room temperature, the reaction was continued at 180° C. for 9 hours to complete imidation. The thus-obtained reaction liquid was added to methanol to isolate the polymer. The polymer was dried, dissolved in dimethylformamide, and again added to methanol to isolate the polymer. The polymer was dried at reduced pressure to provide a purified powder of polyamideimide A. 60 g of the polyamideimide A powder was dissolved in 200 g of NMP to provide adhesive varnish A.

(2) Adhesive Varnish B of Polyamideimide B

In a 5 liter four neck flask equipped with a thermometer, an agitator, a nitrogen inlet tube, and a fractionating column, 143.5 g (0.35 mol) of 2,2-bis[4-(4-aminophenoxy)phenyl] propane and 37.2 g (0.15 mol) of 1,3-bis(aminopropyl) tetramethyldisloxane were introduced under nitrogen, and dissolved in 1200 g of NMP. The solution was treated in the same manner as the polyamideimide A described above to provide a powder of polyamideimide B. 60 g of the polyamideimide B powder was dissolved in 200 g of NMP to provide adhesive varnish B.

(3) Adhesive Varnish C of Polyamideimide C

In a 5 liter four neck flask equipped with a thermometer, an agitator, a nitrogen inlet tube, and a fractionating column, 123.0 g (0.3 mol) of 2,2-bis[4-(4-aminophenoxy)phenyl] propane and 49.6 g (0.2 mol) of 1,3-bis(aminopropyl) tetramethyldisloxane were introduced under nitrogen, and dissolved in 1200 g of NMP. The solution was treated in the same manner as the polyamideimide A described above to provide a powder of polyamideimide B. 60 g of the polyamideimide C powder was dissolved in 200 g of NMP to provide adhesive varnish C.

(4) Adhesive Varnish D of Polyamideimide D

In a 5 liter four neck flask equipped with a thermometer, an agitator, a nitrogen inlet tube, and a fractionating column, 61.5 g (0.15 mol) of 2,2-bis[4-(4-aminophenoxy)phenyl] propane and 86.8 g (0.35 mol) of 1,3-bis(aminopropyl) tetramethyldisloxane were introduced under nitrogen, and dissolved in 1200 g of NMP. The solution was treated in the same manner as the polyamideimide A described above to provide a powder of polyamideimide D. 60 g of the polyamideimide D powder was dissolved in 200 g of NMP to provide adhesive varnish D.

(5) Adhesive Varnish E 15 parts by weight of silicone rubber filler ("Torayfil E-601" manufactured by Dow Corning Toray Silicone, Co., Ltd.) was added to 85 parts by weight of the adhesive varnish A of the polyamideimide A to provide adhesive varnish E.

(6) Adhesive Varnish F 20 parts by weight of silica filler ("Adomafine SO-25R" manufactured by Tatsumori:KK) was added to 80 parts by weight of the adhesive varnish B of the polyamide imide B to provide adhesive varnish F.

Each of the adhesive varnishes A to F was spread on a glass plate at a thickness of 90 μm respectively, dried at 100° C. for 10 minutes, peeled from the glass plate, fixed to an iron frame, and dried at 200° C. for 10 minutes, and at 300° C. for 10 minutes to provide an adhesive layer film having a thickness of 25 μm. The Tg, the coefficient of linear expansion, and the storage elastic modulus of each film were measured as follows. The results are shown in TABLE 1.

The Tg was measured by a penetration method at a temperature rising rate of 10° C./min, and a tensile load of 10 g using "TMA120" manufactured by Seiko Instruments Inc.

The coefficient of linear expansion was measured at a temperature rising rate of 10° C./min, a tensile load of 10 g and a temperature of 80 to 120° C. using "TMA120" manufactured by Seiko Instruments Inc.

The storage elastic modulus was measured at a frequency of 10 Hz, an amplitude of 10 μm, and an automatically controlled tensile load using "DVE rheospectler" manufactured by Rheoroji:KK.

TABLE 1

| Adhesive varnish | Tg (° C.) | Coefficient of linear expansion (ppm) | Storage elastic modulus (GPa) |
| --- | --- | --- | --- |
| A | 230 | 55 | 3.5 |
| B | 180 | 65 | 2.3 |
| C | 160 | 68 | 2.0 |
| D | 100 | 80 | 1.5 |
| E | 230 | 60 | 2.8 |
| F | 180 | 60 | 3.3 |

2. Adhesive Film Production

Using the adhesive varnishes A to F, adhesive films were produced as follows.

Example 1

As a support film, a polyimide film, which was chemically surface-treated by a coupling agent, with a thickness of 25 μm ("Upilex SGA" manufactured by Ube Industries, Ltd. having water absorption of 1.3% by weight, and coefficient of thermal expansion of $1 \times 10^{-5}$/° C.) was used. The adhesive varnish B of the polyamideimide B was coated onto the support film, and dried at 100° C. for 10 minutes, and at 300° C. for 10 minutes to provide an adhesive film having the structure shown in FIG. 1 where the adhesive layers, each having a thickness of 12.5 μm, were formed on both surfaces of the support film.

Example 2

An adhesive film was produced in the same manner as Example 1 except that as a support film, a polyimide film, which was chemically surface-treated by a plasma treatment, with a thickness of 25 μm ("Upilex SPA" manufactured by Ube Industries, Ltd. having water absorption of 1.3% by weight, and coefficient of thermal expansion of $1\times10^{-5}/°C$.) was used.

Example 3

An adhesive film was produced in the same manner as Example 1 except that the adhesive varnish C of the polyamideimide C was used.

Example 4

An adhesive film was produced in the same manner as Example 2 except that the adhesive varnish C of the polyamideimide C was used.

Comparative Example 1

An adhesive film was produced in the same manner as Example 2 except that the adhesive layers, each having a thickness of 20 μm after drying, were formed on both surfaces of the support film using the adhesive varnish B of the polyamideimide B.

Comparative Example 2

An adhesive film was produced in the same manner as Example 2 except that the adhesive layers, each having a thickness of 5 μm after drying, were formed on both surfaces of the support film using the adhesive varnish B of the polyamideimide B.

Comparative Example 3

An adhesive film was produced in the same manner as Example 2 except that the adhesive varnish A of the polyamideimide A was used.

Comparative Example 4

An adhesive film was produced in the same manner as Example 2 except that the adhesive varnish D of the polyamideimide D was used.

Comparative Example 5

An adhesive film was produced in the same manner as Example 2 except that the adhesive varnish E was used.

Comparative Example 6

An adhesive film was produced in the same manner as Example 2 except that the adhesive varnish F was used.

TABLE 2 summarizes total thicknesses of films, overflow lengths, low temperature adhesion properties, and temperature cycle properties of the adhesive films in Examples and Comparative Examples. Respective properties were measured and evaluated as follows.

The overflow length was determined by cutting each film in Examples 1 to 4 and Comparative Examples 3 to 6 to a size of 19×50 mm, pressing it at a temperature of 350° C. and at a pressure of 3 MPa for 1 minute, and measuring the length of the adhesive layer, that overflowed from a longitudinal side of the film in a perpendicular direction, at a midpoint of the longitudinal side of the film.

The low temperature adhesion property was evaluated as follows: Each adhesive film was die cut using a die in a rectangular shape, mounted on a copper alloy lead frame having a thickness of 0.15 mm so that the film was contacted with inner leads each having a width of 0.2 mm in a 0.2 mm space, and pressed at a temperature of 280° C. and at a pressure of 3 MPa for 3 seconds to produce a lead frame with the adhesive film. The lead frame with the adhesive film was dropped to the ground from a height of 2 m to evaluate the low temperature adhesion property. If the adhesive film did not peel off, it was "good". If the adhesive film peeled off, it was "bad".

Temperature Cycle Property

The same type of lead frame with the adhesive film produced as in the above-described low temperature adhesion property evaluation was used. A semiconductor element was pressed on a surface of the adhesive layer at a temperature of 280° C. and at a pressure of 3 MPa for 3 seconds. The lead frame was connected to the semiconductor element using a bonding wire made of gold. A biphenyl based epoxy resin molding material ("CEL-9200" manufactured by Hitachi Chemical Co., Ltd.) was used to seal via transfer molding, and cured at 175° C. for 6 hours to produce a semiconductor device shown in FIG. 2.

The thus-obtained semiconductor device was allowed to stand at −65° C. for 30 minutes, and then at 175° C. for 30 minutes, which formed one cycle. 1000 cycles were conducted. The temperature cycle property was evaluated by monitoring the breakage of the gold wire connecting the semiconductor element and the lead frame. If no breakage was detected, it was "good". If the breakage was detected, it was "bad".

TABLE 2

| | Type of varnish | Total thickness of film (μm) | Overflow length (mm) | Low temp. adhesion property | Temp. cycle property |
|---|---|---|---|---|---|
| Ex. 1 | B | 50 | 0.2 | Good | Good |
| Ex. 2 | B | 50 | 0.2 | Good | Good |
| Ex. 3 | C | 50 | 0.4 | Good | Good |
| Ex. 4 | C | 50 | 0.4 | Good | Good |
| Comp. Ex. 1 | B | 65 | — | Good | Bad |
| Comp. Ex. 2 | B | 35 | — | Bad | Bad |
| Comp. Ex. 3 | A | 50 | 0.1 | Bad | Bad |
| Comp. Ex. 4 | D | 50 | 2.5 | Good | Bad |
| Comp. Ex. 5 | E | 50 | 0.1 | Bad | Good |
| Comp. Ex. 6 | F | 50 | 0.2 | Good | Bad |

The data in TABLES 1 and 2 show that all adhesive films in Examples 1 to 4 satisfy the properties prescribed by the present invention, and are excellent in terms of both low temperature adhesive property and temperature cycle property. In contrast, the adhesive film of Comparative Example 1 has a thicker total thickness than that prescribed by the present invention, and has poor temperature cycle property. The adhesive film of Comparative Example 2 has a thinner total thickness than that prescribed by the present invention, and has poor low temperature adhesion property and poor temperature cycle property. The adhesive film of Comparative Example 3 has higher Tg and higher storage elastic modulus than that prescribed by the present invention, and has poor low temperature adhesion property and poor temperature cycle property. The adhesive film of Comparative Example 4 has higher coefficient of linear expansion than that prescribed by the present invention, and has poor temperature cycle property. The adhesive film of Comparative Example 5 has higher Tg than that prescribed by the present invention, and has poor low temperature adhesion property. The adhesive film of Comparative Example 6 has higher storage elastic modulus than that prescribed by the present invention, and has poor temperature cycle property.

The adhesive film according to the present invention enables good adhesion at low temperatures and is advantageously utilized, especially for manufacturing a copper lead frame with the adhesive film. A semiconductor device manufactured by using the lead frame with the adhesive film demonstrates an excellent temperature cycle property and high reliability.

The present disclosure relates to subject matter contained in Japanese Patent Application No. 2001-238218, filed on Aug. 6, 2001 and Japanese Patent Application No. 2002-196226, filed on Jul. 4, 2002, the disclosure of which is expressly incorporated herein by reference in its entirety.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. An adhesive film for semiconductor, comprising:
   a support film; and
   adhesive layers formed on both surfaces of the support film,
   wherein each one of the adhesive layers comprises an adhesive containing a thermoplastic resin and having a glass transition temperature of 200° C. or less, a coefficient of linear expansion of 70 ppm or less, and a storage elastic modulus of 3 GPa or less, and the adhesive film has a total thickness of between 43 and 57 $\mu$m.

2. An adhesive film for semiconductor according to claim 1, wherein the glass transition temperature is 120° C. or more.

3. An adhesive film for semiconductor according to claim 1, wherein the coefficient of linear expansion is 30 ppm or more.

4. An adhesive film for semiconductor according to claim 1, wherein the storage elastic modulus is 1 GPa or more.

5. An adhesive film for semiconductor according to claim 1, wherein each one of the adhesive layers has a thickness of 1 to 30 $\mu$m.

6. An adhesive film for semiconductor according to claim 1, wherein the support film has a thickness of 5 to 50 $\mu$m.

7. A lead frame with an adhesive film for semiconductor, comprising: a lead frame, and an adhesive film for semiconductor according to claim 1 adhered to the lead frame.

8. A semiconductor device, comprising a lead frame and a semiconductor element, wherein the lead frame and the semiconductor element are adhered to each other by means of an adhesive film for semiconductor according to claim 1.

9. An adhesive film for semiconductor according to claim 1, wherein an overflow length of the adhesive is 2 mm or less; the overflow length of the adhesive being a length of the adhesive that overflows from a longitudinal side of an adhesive film sample in a perpendicular direction, being measured at a midpoint of the longitudinal side of the adhesive film sample, after the adhesive film sample is pressed at a pressure of 3 MPa and at a temperature of 350° C. for 1 minute; the adhesive film sample having a total thickness of 50 $\mu$m, a width of 19 mm, and a length of 50 mm, which comprises a support film having a thickness of 25 $\mu$m and two adhesive layers each having a thickness of 12.5 $\mu$m on both sides of the support film.

10. An adhesive film for semiconductor according to claim 9, wherein said overflow length is 0.5 mm or less.

11. An adhesive film for semiconductor according to claim 1, wherein said total thickness is 45–55 $\mu$m.

12. An adhesive film for semiconductor according to claim 11, wherein said total thickness is 47–53 $\mu$m.

13. An adhesive film for semiconductor according to claim 1, wherein said glass transition temperature is 120° C.–200° C., the coefficient of linear expansion is 30 ppm to 70 ppm, and the storage elastic modulus is 1 to 2.8 GPa.

14. An adhesive film for semiconductor according to claim 13, wherein said glass transition temperature is 160° C. to 185° C., the coefficient of linear expansion is 50 to 68 ppm, and the storage elastic modulus is 1.5 to 2.5 GPa.

15. An adhesive film for semiconductor according to claim 1, wherein said thermoplastic resin is a heat-resistant thermoplastic resin selected from the group consisting of polyimides and polyamides.

16. An adhesive film for semiconductor according to claim 15, wherein said heat-resistant thermoplastic resin includes 10 mol % to 90 mol % amide group, based on the total amount of amide group and amide group after amide ring closure.

17. An adhesive film for semiconductor according to claim 16, wherein said heat-resistant thermoplastic resin includes 30 mol % to 50 mol % amide group, based on the total amount of amide group and amide group after amide ring closure.

* * * * *